(12) United States Patent
Fukazawa et al.

(10) Patent No.: US 7,239,182 B2
(45) Date of Patent: Jul. 3, 2007

(54) PREDRIVER CIRCUIT

(75) Inventors: Hidetaka Fukazawa, Miyagi (JP); Kotaro Okada, Sakura (JP)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 11/122,908

(22) Filed: May 5, 2005

(65) Prior Publication Data

US 2005/0280440 A1 Dec. 22, 2005

(30) Foreign Application Priority Data

Jun. 14, 2004 (JP) .............................. 2004-175514

(51) Int. Cl.
*H03K 19/094* (2006.01)
*H03L 5/00* (2006.01)
(52) U.S. Cl. ....................................... 326/83; 327/333
(58) Field of Classification Search .................. 326/83
See application file for complete search history.

(56) References Cited

U.S. PATENT DOCUMENTS 4,818,901 A * 4/1989 Young et al. ................. 326/27
5,546,029 A * 8/1996 Koke ........................... 327/108
6,037,842 A * 3/2000 Bryan et al. .................... 331/57
6,130,549 A * 10/2000 Buck ............................ 326/26
6,919,870 B2 * 7/2005 Fukuda ......................... 345/90
7,034,627 B1 * 4/2006 Kudari ......................... 331/143

FOREIGN PATENT DOCUMENTS

JP      2000082946 A     3/2000

\* cited by examiner

*Primary Examiner*—Rexford Barnie
*Assistant Examiner*—Thienvu Tran
(74) *Attorney, Agent, or Firm*—Charles Bergere

(57) ABSTRACT

A predriver circuit that is capable of reducing the size of a drive transistor while preventing a drive transistor's gate from being destroyed, thereby reducing power consumption. The predriver circuit includes a current mirror circuit, which has a pair of transistors that are connected to a predriver power supply voltage; a level shifter circuit, which is connected to a first transistor via a self-bias circuit; and a discharge transistor, which is connected to a second transistor. A terminal connecting the second transistor to the discharge transistor is connected to a top gate of a high-side MOS transistor for a half-bridge connected drive circuit.

3 Claims, 4 Drawing Sheets

PREDRIVER CIRCUIT

FIELD OF THE INVENTION

The present invention relates to a predriver circuit for driving a MOS transistor that is mounted on a high side for full-bridge connection, half-bridge connection, or other driver bridge connections.

BACKGROUND OF THE INVENTION

A full-bridge connection, half-bridge connection, or other similar drive circuit is known as a drive circuit for driving a motor or the like (refer, for instance, to JP-A No. 82946/2000 (FIG. 3) hereafter "patent document 1"). A full-bridge connection drive circuit, which is effectively available over a wide power supply voltage range, is disclosed by Patent Document 1.

Conventionally, a half-bridge connection drive circuit 500 shown in FIG. 4 was used. The drive circuit 500 uses a connection node between a high-side MOS transistor Q1 and low-side MOS transistor Q2, for which a drain terminal is connected to the drive circuit power supply voltage VM, as an output terminal OP. These MOS transistors Q1, Q2 are power MOS transistors and have switching functions. A predriver circuit is connected to each gate in order to drive the MOS transistors Q1, Q2.

The low-side MOS transistor Q2 for the drive circuit 500 is grounded. Therefore, when a voltage of 10 V is to be applied to the gate of MOS transistor Q2 during a normal operation, a voltage Vls between 0 V and 10 V is applied to the gate of MOS transistor Q2.

Meanwhile, a source terminal of the high-side MOS transistor Q1 for the drive circuit 500 is the output terminal OP of the drive circuit 500. Therefore, the voltage Vhs to be applied to a gate of MOS transistor Q2 needs to be applied until the sum of the voltage of the output terminal OP (output voltage Vout) and the gate-to-source voltage VGS of MOS transistor Q1 is reached. The output voltage Vout varies from 0 V to the drive circuit power supply voltage VM. Therefore, when gate-to-source voltage VGS having a potential difference of 10 V is required for MOS transistor Q1 during a normal operation, a voltage between 0 V and 25 V needs to be applied to the gate of high-side MOS transistor Q1 if the drive circuit power supply voltage VM is 15 V. If, in this instance, a voltage of 25 V is applied to the gate of MOS transistor Q1 for rapid charging purposes, the gate voltage of MOS transistor Q1 may become instantaneously excessive, thereby damaging the gate.

Further, the predriver circuit shown in FIG. 4 was provided with a circuit that adjusts the voltage of top gate TG while detecting the output voltage Vout of the source terminal of the high-side MOS transistor, that is, the output terminal OP. More specifically, a source reference circuit 505, a protection circuit 506, a clamp circuit 507, and other circuits were provided between the source terminal and gate terminal of MOS transistor Q1. The source reference circuit 505 controls the voltage of the gate terminal with reference to the voltage of the source terminal. The protection circuit 506 is an ESD protection circuit that protects the predriver circuit when static electricity or the like is discharged from the output terminal OP, which is connected to an external device. The clamp circuit 507 protects the source reference circuit 505 and gate terminal when an excessive electrical stress is generated at the output terminal OP. More specifically, the clamp circuit 507 generates a current flow to decrease the potential difference, thereby reducing the electrical stress. In other words, the conventional circuitry was configured to statically provide an operating state.

However, the source reference circuit, protection circuit, and clamp circuit need to be constantly operated to protect the circuitry against a circuit stress generated during operation of the conventional predriver circuit. Thus, electrical power is constantly supplied to the source reference circuit, protection circuit, and clamp circuit. As a result, the power consumption of the conventional predriver circuit is quite high. Therefore, the conventional predriver circuit cannot be used in portable products, which have a limited power supply capacity.

The present invention has been made in view of the above circumstances and provides a predriver circuit so that achieves downsizing and power consumption minimization while preventing a drive's transistor gate from being damaged.

SUMMARY OF THE INVENTION

Figure 1:
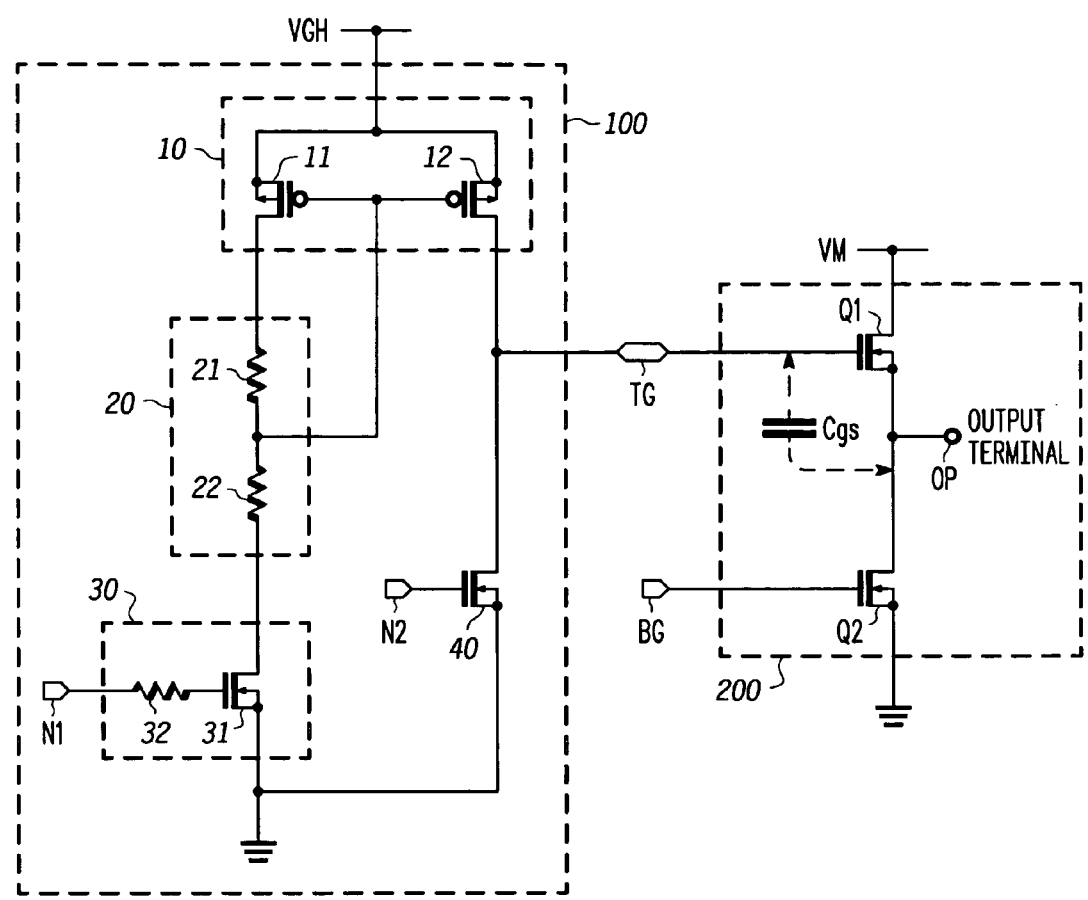
FIG. 1 is a circuit diagram of one embodiment of a predriver circuit according to the present invention.

To solve the above problems, the present invention provides a predriver circuit that is connected to a top gate of a high-side MOS transistor in a full-bridge-connected or half-bridge-connected drive circuit whose output terminal is a connection node between a current output terminal of the high-side MOS transistor, for which a current input terminal is connected to a drive power supply voltage, and a current input terminal of a low-side MOS transistor whose current output terminal is grounded. The predriver circuit comprises a power supply circuit that is connected to the top gate to turn ON the high-side MOS transistor; and an input terminal for entering a signal that drives the power supply circuit. The sum of a voltage resulting from a charge stored in a gate capacitor due to a current supplied from the power supply circuit and a voltage applied to the connection node is applied to the top gate. The power supply circuit is a current source that supplies current at a voltage buildup rate at which the gate of the high-side MOS transistor does not become damaged. In this instance, the top gate voltage gradually increases until the high-side MOS transistor turns ON. When the high-side MOS transistor turns ON, the top gate voltage increases as the sum of the voltage resulting from the charge stored in the gate capacitor and the voltage present at the output terminal. Consequently, no high voltage will be suddenly applied to a potential of the high-side MOS transistor's current output terminal. Further, no great potential difference will arise between the source terminal and top gate. As a result, the power consumption can be reduced because the use of a protection circuit or clamp circuit is not required.

To solve the problems described earlier, the present invention is such that the top gate is connected to the current output terminal of the high-side MOS transistor only via a gate capacitor. Therefore, when the employed setup is such that a small amount of current flows to the top gate, the top gate voltage increases with an increase in the current output from the MOS transistor current output terminal. Since the top gate voltage has a transition characteristic so as to follow the output terminal voltage, no great potential difference will arise between the top gate and high-side MOS transistor current output terminal. Consequently, the power consumption can be reduced because the use of a protection circuit or clamp circuit is not required.

In the predriver circuit according to the present invention, the power supply circuit supplies current so that the voltage rise time of the top gate is within a predetermined time. Therefore, the predriver circuit can adjust the top gate voltage as specified within a predetermined period of time while avoiding gate destruction by preventing the potential difference between the high-side MOS transistor top gate and current output terminal from exceeding a predetermined level.

In the predriver circuit according to the present invention, the power supply circuit is a current mirror circuit comprising a pair of transistors whose gate terminals are interconnected. A current output terminal of a first transistor of the transistor pair is connected to a level shifter circuit and bias circuit for determining a current value that is output from the current mirror circuit. The input terminal is a gate terminal of the level shifter circuit. Therefore, the power supply circuit can be simply configured to serve as a current source that supplies current at a voltage buildup rate at which the gate of the high-side MOS transistor does not become damaged.

In the predriver circuit according to the present invention, the current output terminal of a second transistor of the transistor pair is grounded via a discharge transistor. The discharge transistor is turned OFF to supply current to the top gate for the purpose of raising the voltage of the top gate. The discharge transistor is turned ON to ground the top gate for the purpose of lowering the voltage of the top gate. The discharge transistor has an ON resistor that lowers the voltage while maintaining a potential higher than the voltage of the connection node of the high-side MOS transistor. Therefore, when the voltage decreases, the charge polarities of the top gate side and high-side connection node side of the gate capacitor do not invert. Consequently, the voltage between the top gate and current output terminal of a high-side NMOS transistor can be prevented from exceeding a predetermined level even when the output terminal voltage is decreased. As a result, it is possible to avoid gate destruction.

In the predriver circuit according to the present invention, the high-side MOS transistor is an N-channel MOS transistor. Therefore, the ON resistance is smaller than when a P-channel MOS transistor is used. As a result, the required area can be reduced for downsizing purposes.

The present invention makes it possible to achieve reduced size and power consumption while preventing a drive's transistor gate from being damaged.

DETAILED DESCRIPTION OF THE INVENTION

One embodiment of the present invention will now be described with reference to FIGS. 1 through 3. As shown in FIG. 1, a predriver circuit 100 according to the present embodiment is connected to a high side of a drive circuit 200 that forms a half bridge.

The predriver circuit comprises a current mirror circuit 10, a self-bias circuit 20, a level shifter circuit 30, and a discharge transistor 40. The current mirror circuit 10, self-bias circuit 20, and level shifter circuit 30 constitute a power supply circuit, which functions as a current source that supplies current for driving the drive circuit 200.

The current mirror circuit 10 comprises a pair of transistors 11, 12. In the present embodiment, each of these transistors 11, 12 is a PMOS transistor. The source terminals of the transistors 11, 12 are connected to the predriver power supply voltage VGH. The gate terminals of the transistors 11, 12 are interconnected. The drain terminal of a first transistor 11 is grounded as a current output terminal via the self-bias circuit 20 and level shifter circuit 30. The drain terminal of a second transistor 12 is grounded via the discharge transistor 40.

In the present embodiment, the self-bias circuit 20 comprises a first resistor 21 and a second resistor 22, which are series-connected. The connection node for the first and second resistors 21, 22 is connected to the gate terminals of the transistors 11, 12 for the current mirror circuit 10.

The level shifter circuit 30 includes an NMOS transistor 31. The gate terminal of the NMOS transistor 31 is connected to a first input terminal N1 via a resistor 32. A digital signal is input to the first input terminal N1. When a High-level signal is input to the first input terminal N1, the NMOS transistor 31 turns ON to maintain the gate voltages of transistors 11 and 12 constant and control the amount of current flowing to transistor 11, self-bias circuit 20, and level shifter circuit 30. Further, a desired current flows to transistor 12 of the current mirror circuit 10 in accordance with the size ratio to transistor 11.

In the present embodiment, the discharge transistor 40 comprises an NMOS transistor. The drain terminal of the discharge transistor 40 is connected to the drain terminal of transistor 12 for the current mirror circuit 10. The source terminal of the discharge transistor 40 is grounded. The gate terminal of the discharge transistor 40 is connected to a second input terminal N2 to which a digital signal is input. Therefore, the path between the drain and source terminals of the discharge transistor 40 is energized or deenergized in accordance with the signal of the second input terminal N2.

Meanwhile, the half-bridge connected drive circuit 200 comprises two MOS transistors Q1, Q2 as is the case with a conventional one. More specifically, the two MOS transistors Q1, Q2 are N-channel power MOS transistors. As regards the high-side MOS transistor Q1, its drain terminal, which serves as a current input terminal, is connected to the drive circuit power supply voltage VM, which serves as a drive power supply voltage. The gate terminal (hereinafter referred to as the top gate TG) of the high-side MOS transistor Q1 is connected to the drain terminal of transistor 12 for the predriver circuit 100. MOS transistor Q1 turns ON when a voltage higher than a threshold voltage Vth is applied to the top gate TG with reference to the source terminal of MOS transistor Q1. The path between the drain terminal and the source terminal, which serves as a current output terminal, is then energized. Owing to capacitive coupling, a gate capacitance Cgs is generated between the gate and source terminals of MOS transistor Q1. The gate capacitance Cgs is a relatively great value because MOS transistor Q1 is a power MOSFET.

The source terminal of MOS transistor Q1 is connected to the output terminal OP. The output terminal OP is connected to a drive target (not shown) that is to be driven. The source terminal of MOS transistor Q1 is also connected to the drain terminal (current input terminal) of the low-side MOS transistor Q2.

The gate terminal of MOS transistor Q2 (hereinafter referred to as the bottom gate BG) is connected to a predetermined power supply voltage (e.g., 10 V) via a switching device not shown. The source terminal (current output terminal) of MOS transistor Q2 is grounded. Therefore, when a voltage is applied to the gate terminal to turn ON MOS transistor Q2, it places the output terminal OP at a ground potential.

The operation of the predriver circuit 100, which is configured as described above, will now be described with reference to FIGS. 2 and 3. FIG. 2 shows voltage changes during an ON process. FIG. 3 shows voltage changes during an OFF process. In these figures, a solid line indicates the voltage of the top gate TG; a broken line, the output voltage Vout of the output terminal OP; and a two-dot chain line, the voltage of the bottom gate BG.

The ON process and OFF process will be described below. The ON process is performed to raise the voltage of the output terminal OP from 0 V to the drive circuit power supply voltage VM and drive a motor or other drive target. The OFF process is performed to lower the voltage of the output terminal OP from the drive circuit power supply voltage VM to 0 V and stop the drive target. The present embodiment applies a predriver power supply voltage VGH of 25 V and a drive circuit power supply voltage VM of 15 V. Further, the present embodiment uses a transistor having a threshold value Vth of 2 V as MOS transistor Q1 for the drive circuit 200.

[ON Process]

Figure 2:
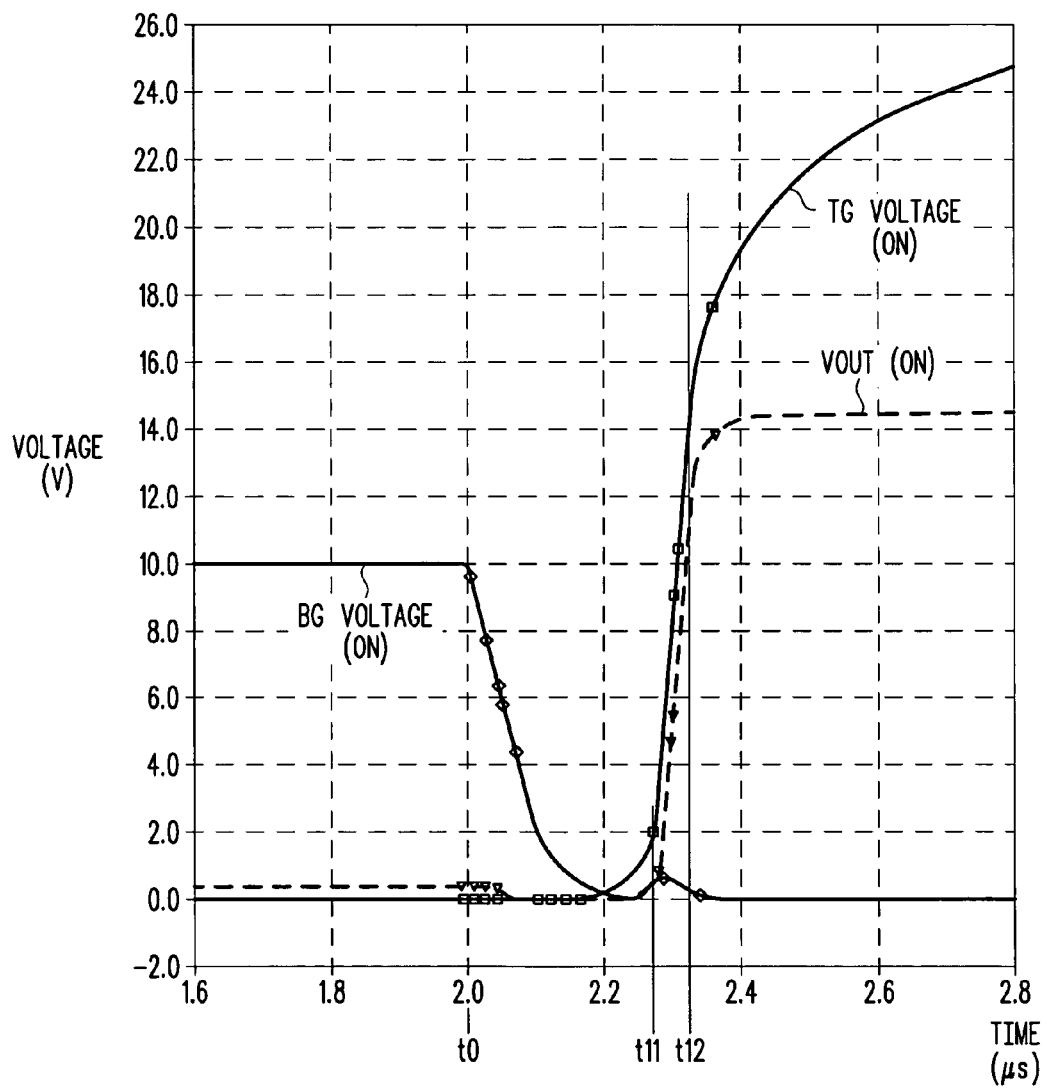
FIG. 2 shows how an output voltage and top gate voltage change during an ON process.

As indicated in FIG. 2, the top gate TG is at a voltage of approximately 0 V before the drive target is driven. Therefore, MOS transistor Q1 is OFF and the drive circuit power supply voltage VM is not output to the output terminal OP. In this instance, a voltage of approximately 10 V is applied to the bottom gate BG. Consequently, MOS transistor Q2 turns ON, the output terminal OP is grounded, and its output voltage Vout is 0 V.

As indicated in FIG. 2, it is assumed that a High level signal is input to the first input terminal N1 at time t0 (2.0 μs). In this instance, the NMOS transistor 31 turns ON so that the predriver power supply voltage VGH supplies a predetermined amount of current via transistor 11, self-bias circuit 20, and level shifter circuit 30.

At time t0, a Low level signal is input to the second input terminal N2 so that the discharge transistor 40 turns OFF. Transistors 12 and 11 constitute the current mirror circuit 10. Therefore, a desired amount of current is supplied to transistor 12 in accordance with the reference current for transistor 11 and the size ratio between transistors 11 and 12. This current is supplied to the top gate TG because the discharge transistor 40 is OFF. This current begins to charge the gate capacitor Cgs, and the voltage of the top gate TG is raised in accordance with a time constant that is determined when the gate capacitor Cgs is charged by a current supplied via transistor 12. In other words, the current supplied to the top gate TG via transistor 12 is set so that the gate-to-source voltage VGS of MOS transistor Q1 is maintained below a certain level. At time t0, the switching device connected to the bottom gate BG is turned OFF so that the voltage (10 V) applied to the bottom gate BG begins to drop.

When the raised voltage of the top gate TG exceeds a threshold value (2 V) for MOS transistor Q1 at time t11 (approximately 2.26 μs), MOS transistor Q1 turns ON. In this instance, the bottom gate BG is at a voltage of approximately 0 V and MOS transistor Q2 is OFF. Therefore, the output voltage Vout of the output terminal OP, that is, the source terminal voltage of MOS transistor Q1, begins to increase until it is equivalent to the drive circuit power supply voltage VM. Consequently, when the output voltage Vout (the source terminal voltage of MOS transistor Q1) increases, the voltage of the top gate TG increases in such a manner as to represent the sum of the output voltage Vout and a voltage generated by a potential that is stored in the gate capacitor Cgs by a current supplied via transistor 12. The voltage of the top gate TG increases at a far higher rate when an increase in the output voltage Vout increases the top gate voltage via the gate capacitor Cgs than when a current supplied via transistor 12 charges the gate capacitor Cgs. In FIG. 2, therefore, the voltage of the top gate TG mainly increases with an increase in the output voltage Vout.

Subsequently, at approximately time t12 (approximately 2.32 μs), the voltage at the output terminal OP is nearly constant at 15 V and equal to the drive circuit power supply voltage VM. In this instance, the voltage of the top gate TG does not increase with an increase in the output voltage Vout. In this instance, too, a current is supplied to the top gate TG via transistor 12 so that the gate capacitor Cgs is continuously charged. This ensures that the voltage of the top gate TG increases to the predriver power supply voltage VGH (25 V in the currently example). In the present embodiment, the voltage of the top gate TG rises to the predriver power supply voltage VGH during the time interval between the instant (time t0) at which a signal is input to the second input terminal N2 and the instant (e.g., 3 μs) at which a predetermined period of time (e.g., 1 μs) elapses after time t0.

As described above, the voltage of the top gate TG increases during the time interval between time t0 and time t11 at a predetermined rate as it is charged by the gate capacitor Cgs for transistor 12 and MOS transistor Q1. During the time interval between time t11 and t12, the voltage of the top gate TG further increases using a charge that is stored in the gate capacitor Cgs due to an increase in the output voltage Vout. At time t12 and later, the voltage of the top gate TG increases to the predriver power supply voltage VGH while the gate capacitor Cgs is charged. In other words, the predriver circuit 100 increases the potential of the top gate TG by exercising control to maintain the gate-to-source voltage VGS of MOS transistor Q1 below a certain level while making use of the transition characteristic prevailing when the gate capacitor Cgs starts up (charging period) as it is charged by a current and output voltage Vout from transistor 12.

[OFF Process]

The OFF process for stopping the drive will now be described. While the predriver circuit is running, the predriver power supply voltage VGH (25 V in the current example) is applied to the top gate TG as indicated in FIG. 3. During a drive period, the output terminal OP is at the drive circuit power supply voltage VM (15 V in the current example) and the bottom gate BG is at a voltage of approximately 0 V.

Figure 3:
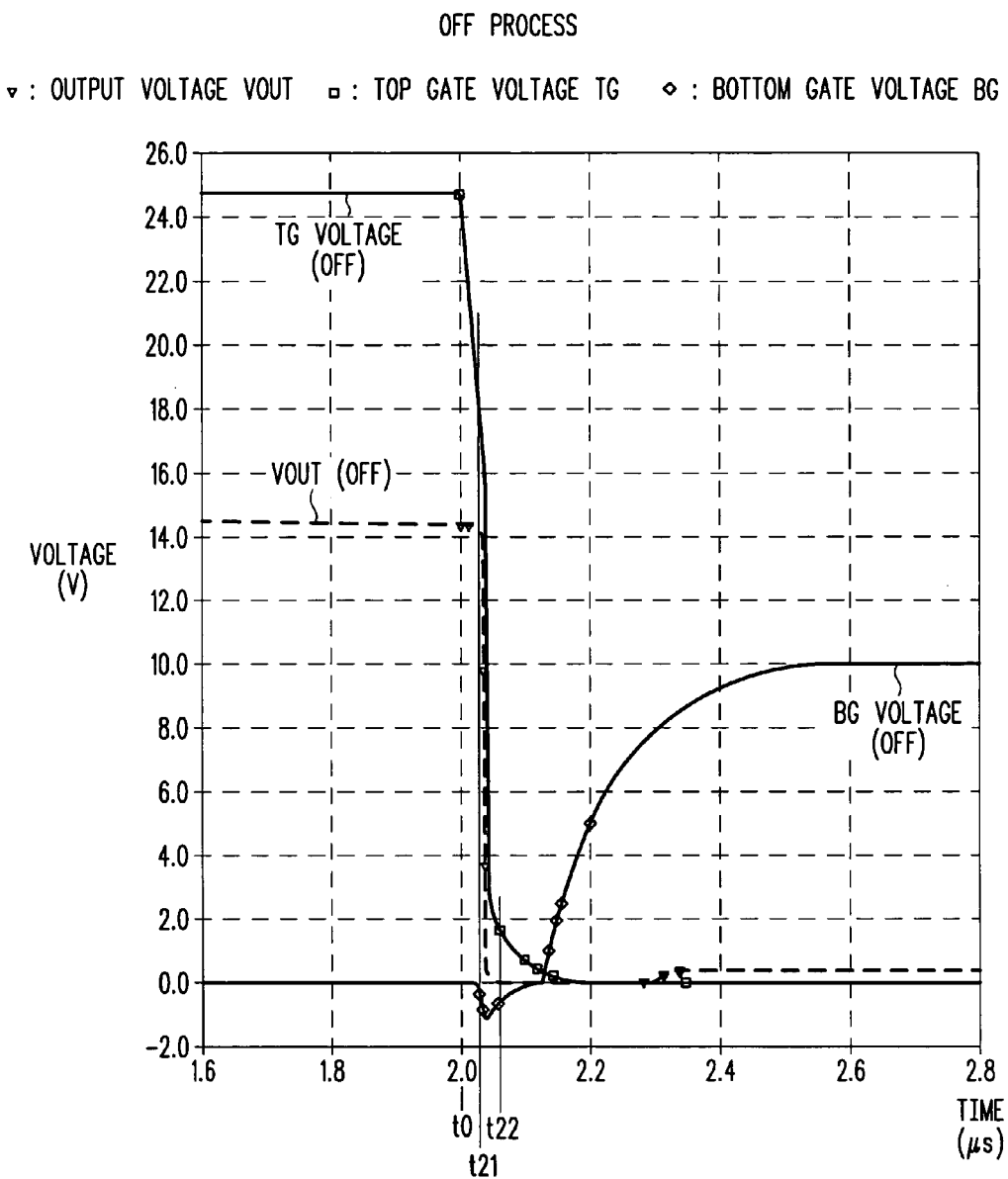
FIG. 3 shows how an output voltage and top gate voltage change during an OFF process.
Figure 4:
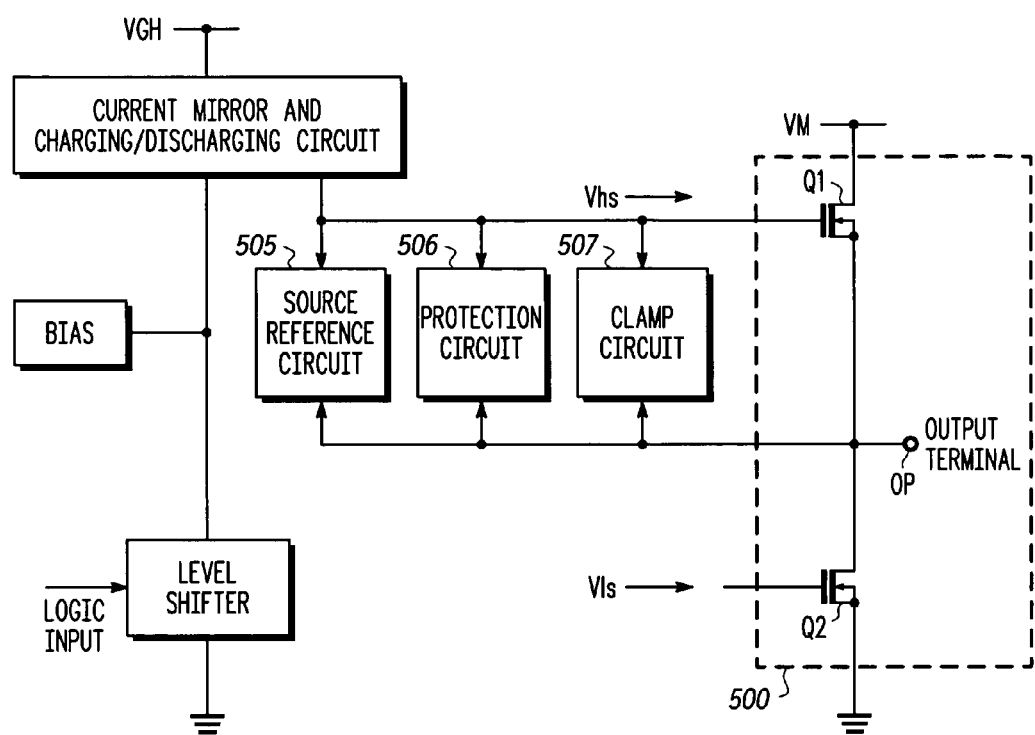
FIG. 4 is a block diagram illustrating a conventional predriver circuit.

It is assumed, as indicated in FIG. 3, that a Low level signal is input to the first input terminal N1 at time t0 with a High level signal input to the second input terminal N2. Transistor 12 then turns OFF with the discharge transistor 40 turning ON. In this instance, a voltage of 0 V is input to the bottom gate BG and MOS transistor Q2 is OFF. Therefore, the charge stored in the gate capacitor Cgs for MOS transistor Q1 is released via the discharge transistor 40. When the charge is released in this manner, the voltage of the top gate TG decreases as it is controlled by a time constant that is prescribed by the ON resistor for the discharge transistor 40.

At around time t21 (approximately 2.04 μs) at which the voltage of the top gate TG is below the threshold value Vth for MOS transistor Q1, MOS transistor Q1 turns OFF to shut off the supply of the drive circuit power supply voltage VM to the output terminal OP. Therefore, the charge stored in the gate capacitor Cgs is released via the discharge transistor 40 and output terminal OP. The ON resistor for the discharge transistor 40 is such that the potential of the discharge transistor is lowered but maintained higher than the potential of the output voltage Vout to prevent the gate capacitor Cgs from being rapidly discharged. Consequently, the voltage of the top gate TG decreases more rapidly than in the period between time t0 and time t21 while the gate-to-source voltage VGS is maintained below a certain level.

At around time t22 (approximately 2.06 μs), the output voltage Vout of the output terminal OP is approximately 0 V. In this instance, the charge stored in the gate capacitor Cgs is released via the discharge transistor 40, and the voltage of the top gate TG decreases while assuming a waveform according to a time constant for the ON resistor of the discharge transistor 40 and the gate capacitor Cgs, and finally reaches 0 V.

The present embodiment provides the following advantages. The top gate TG of MOS transistor Q1 for the half-bridge connected drive circuit 200 is connected to the drain terminal of transistor 12, which constitutes the current mirror circuit 10, and the drain terminal of the discharge transistor 40. Therefore, when the output terminal OP is used to drive a motor or other drive target, the voltage of the top gate TG increases due to a current supplied from transistor 12 of the current mirror circuit 10 until MOS transistor Q1 turns ON. In other words, control is exercised so that no high voltage is suddenly applied to the top gate TG. Therefore, the voltage of the top gate TG is controlled so as to avoid gate destruction. When MOS transistor Q1 turns ON, the voltage of the top gate TG rapidly increases as the output voltage Vout of the output terminal OP increases up to the drive circuit power supply voltage VM. Consequently, control is exercised to prevent the potential difference between the gate and source of MOS transistor Q1 from increasing while maintaining the ON state of MOS transistor Q1.

When the output voltage Vout decreases, the voltage of the top gate TG also decreases in accordance with a time constant for the discharge transistor 40 and gate capacitor Cgs until MOS transistor Q1 turns OFF. When MOS transistor Q1 turns OFF, the potential of the top gate TG decreases because the charge currently stored in the gate capacitor Cgs is released mainly in accordance with a decrease in the output voltage Vout. As a result, control is exercised to prevent the potential difference between the gate and source of MOS transistor Q1 from increasing while maintaining the OFF state of MOS transistor Q1.

Since it is possible to avoid the application of a voltage higher than the withstanding voltage of the gate of MOS transistor Q1, the clamp circuit, source reference circuit, and incidental circuits such as a protection circuit can be eliminated from a path between the top gate TG, which is a gate terminal of MOS transistor Q1, and the output terminal OP, which is a source terminal. Consequently, it is possible to reduce the size of the predriver circuit 100. Further, the power consumption is reduced because the electrical power that would be supplied to the eliminated circuits is no longer necessary. As a result, the predriver circuit can be used in portable products, which have a limited power supply capacity.

In the present embodiment, the voltage of the top gate TG rises to the predriver power supply voltage VGH within a predefined period of time. Therefore, the predriver circuit 100 obtains a predetermined top gate voltage within a preselected period of time while maintaining the potential difference between the top gate TG and source terminal of high-side MOS transistor Q1 below a certain level to avoid gate destruction or damage of the top gate TG.

In the present embodiment, the current mirror circuit 10, self-bias circuit 20, and level shifter circuit 30 constitute a circuit that determines the amount of current flowing to the top gate TG. Further, the present embodiment ensures that a control signal is input to the first input terminal N1, which is connected to the gate of the level shifter circuit 30. Therefore, a simple configuration is adequate for causing a predefined current to flow to the top gate TG without regard to the voltage of the top gate TG.

To stop the drive current, the present embodiment shuts off the power supply from the current mirror circuit 10 to the top gate TG and achieves grounding with respect to the top gate TG via the discharge transistor 40. Further, when the voltage of the top gate TG decreases to turn OFF MOS transistor Q1, the gate capacitor Cgs is discharged via not only the discharge transistor 40 but also the output terminal OP. As a result, the drive current is promptly stopped while preventing the voltage applied to the top gate TG from exceeding the gate's withstanding voltage.

In the present embodiment, an N-channel MOS transistor is used as the high-side MOS transistor Q1. Since the ON resistance of the N-channel MOS transistor is smaller than that of a P-channel MOS transistor, the area of MOS transistor Q1 can be minimized for downsizing purposes.

Further, the present embodiment may be modified as described below. In the present embodiment, which has been described above, the predriver circuit 100 is used for the half-bridge connected drive circuit 200. Alternatively, however, the predriver circuit may be used for a full-bridge connected drive circuit or some other bridge connected drive circuit.

The present embodiment, which has been described above, is configured so that the current mirror circuit 10 is used to configure a current source for charging the gate capacitor Cgs to raise the voltage of the top gate TG. Alternatively, however, a current source configured in a different manner may be used.

DESCRIPTION OF THE SYMBOLS

Cgs: High-side MOS transistor gate capacitance
N1: First input terminal
OP: Output terminal
Q1: High-side MOS transistor
Q2: Low-side MOS transistor
TG: Top gate
VM: Drive circuit power supply voltage as drive power supply voltage
10: Current mirror circuit
11: First transistor
12: Second transistor
20: Self-bias circuit as a bias circuit
30: Level shifter circuit
40: Discharge transistor
100: Predriver circuit
200: Drive circuit

The invention claimed is:

1. A predriver circuit connected to a top gate of a high-side MOS transistor of a drive circuit, wherein the drive circuit is connected between a first voltage (VM) and a ground voltage, the predriver circuit comprising:
a current mirror circuit having a first PMOS transistor and a second PMOS transistor, wherein a drain of the second PMOS transistor is connected to the top gate of the high-side MOS transistor of the drive circuit, and the sources of the first and second PMOS transistors are connected to a second voltage (VGH);

a self-bias circuit including first and second series connected resistors, wherein a first terminal of the first resistor is connected to a drain of the first PMOS transistor, and a connection point between the first and second resistors is connected to the gates of the first and second PMOS transistors;

a level shifter circuit including a third transistor and a third resistor, wherein a drain of the third transistor is connected to a terminal of the second resistor, a source of the third transistor is connected to the ground voltage, and a gate of the third transistor is connected to a first input terminal, by way of the third resistor, for receiving a first digital input signal; and a discharge transistor having a drain connected to the drain of the second PMOS transistor, a source connected to the ground voltage, and a gate connected to a second input terminal for receiving a second digital input signal, wherein the discharge transistor comprises a NMOS transistor; and wherein the voltage at the top gate varies from about 0.1V to about 25V.

2. The predriver circuit of claim 1, wherein the first voltage (VM) is about 15V.

3. The predriver circuit of claim 2, wherein the second voltage (VGH) is about 25V.

* * * * *